United States Patent
Cassagne et al.

(10) Patent No.: US 11,710,800 B2
(45) Date of Patent: Jul. 25, 2023

(54) FLEXIBLE LAMINATE OF PHOTOVOLTAIC CELLS AND ASSOCIATED METHOD

(71) Applicant: TOTAL SA, Courbevoie (FR)

(72) Inventors: Valerick Cassagne, Limours (FR); Frederic Leroy, Vincennes (FR)

(73) Assignee: TOTAL SA, Courbevoie (FR)

( * ) Notice: Subject to any disclaimer, the term of this patent is extended or adjusted under 35 U.S.C. 154(b) by 0 days.

(21) Appl. No.: 16/649,446

(22) PCT Filed: Sep. 17, 2018

(86) PCT No.: PCT/EP2018/075099
§ 371 (c)(1),
(2) Date: Mar. 20, 2020

(87) PCT Pub. No.: WO2019/057675
PCT Pub. Date: Mar. 28, 2019

(65) Prior Publication Data
US 2020/0274012 A1    Aug. 27, 2020

(30) Foreign Application Priority Data
Sep. 20, 2017 (FR) ...................................... 1758690

(51) Int. Cl.
*H01L 31/048* (2014.01)
*H01L 31/046* (2014.01)
*H01L 31/18* (2006.01)

(52) U.S. Cl.
CPC ........ *H01L 31/0481* (2013.01); *H01L 31/046* (2014.12); *H01L 31/1876* (2013.01)

(58) Field of Classification Search
None
See application file for complete search history.

(56) References Cited

U.S. PATENT DOCUMENTS

| 5,599,489 A | 2/1997 | Saiki et al. |
| 5,684,325 A | 11/1997 | Kataoka et al. |

(Continued)

FOREIGN PATENT DOCUMENTS

| CN | 1185705 C | 1/2005 |
| EP | 0 680 095 A2 | 11/1995 |

(Continued)

OTHER PUBLICATIONS

International Search Report dated Oct. 15, 2018 in PCT/EP2018/075099 filed Sep. 17, 2018, 3 pages.

(Continued)

*Primary Examiner* — Eli S Mekhlin
(74) *Attorney, Agent, or Firm* — Oblon, McClelland, Maier & Neustadt, L.L.P.

(57) ABSTRACT

A flexible laminate of photovoltaic cells is provided, including a layer of photovoltaic cells that are connected to one another; a front layer and a back layer configured to encapsulate the layer of photovoltaic cells; and an outer film of flexible material with anti-soiling properties disposed on the front layer, the outer film having an average roughness that is less than 1 μm. There is also provided a method for decreasing or limiting soiling on a surface of a flexible laminate of photovoltaic cells, the method including applying an outer film of flexible material with anti-soiling properties to the front layer, the outer film having an average roughness that is less than 1 μm.

22 Claims, 1 Drawing Sheet

(56) References Cited

U.S. PATENT DOCUMENTS

Figure 1:
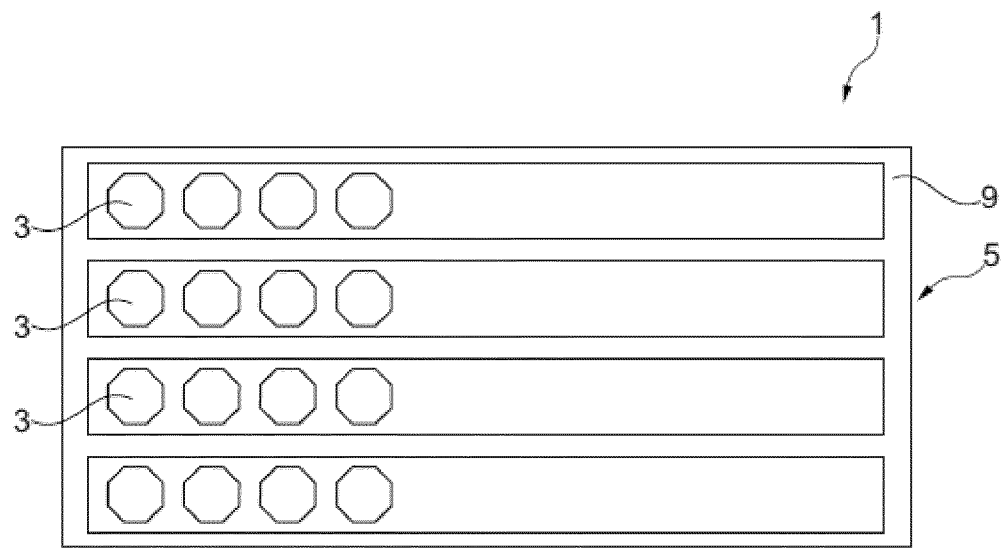

| | | | |
|---|---|---|---|
| 6,414,236 B1 | 7/2002 | Kataoka et al. | |
| 6,762,508 B1* | 7/2004 | Kiso | B32B 17/04 |
| | | | 257/788 |
| 2004/0261836 A1* | 12/2004 | Kataoka | H01L 31/048 |
| | | | 136/244 |
| 2005/0268961 A1* | 12/2005 | Hetzler | H01L 31/0481 |
| | | | 136/251 |
| 2008/0210303 A1* | 9/2008 | Lu | H01L 31/02168 |
| | | | 136/265 |
| 2008/0261037 A1* | 10/2008 | Snow | C08G 18/792 |
| | | | 428/337 |
| 2008/0264481 A1* | 10/2008 | Hayes | B32B 17/10036 |
| | | | 136/256 |
| 2011/0203664 A1 | 8/2011 | Howell et al. | |
| 2015/0171249 A1 | 6/2015 | Howell et al. | |
| 2015/0249166 A1* | 9/2015 | Iitsuka | G02B 5/0294 |
| | | | 252/582 |

FOREIGN PATENT DOCUMENTS

| | | |
|---|---|---|
| EP | 1 065 731 A2 | 1/2001 |
| WO | WO 2010/051355 A2 | 5/2010 |
| WO | WO 2013/042081 A1 | 3/2013 |

OTHER PUBLICATIONS

Chinese Office Action dated Jan. 11, 2023, issued in Chinese Patent Application No. 201880068200.7.

* cited by examiner

FLEXIBLE LAMINATE OF PHOTOVOLTAIC CELLS AND ASSOCIATED METHOD

The present invention relates to the field of photovoltaic panels. More particularly, the present invention relates to laminated photovoltaic panels.

With the advent of renewable energy and in particular solar energy, research in the field of photovoltaic panels composed of one or more photovoltaic cells is burgeoning, in particular for increasing the conversion efficiencies of, and hence the energy produced by, such photovoltaic panels, and for decreasing the operating and maintenance costs of these photovoltaic panels.

Currently, it is desired to make better use of the surfaces of existing industrial or commercial buildings, in particular by installing photovoltaic panels on the roofs thereof. Specifically, for the owner of the building, the generation of electricity may provide additional income or a saving and contribute to improving the economy of use of the building.

However, these commercial or industrial buildings are often constructed with for example a carcass of metal or wood which is dimensioned to meet only the technical constraints in terms of load in order to bear the roof along with insulation and, for example, a snow load, depending on the region in which it is built.

However, because of their weight, it is currently not possible to install some photovoltaic panels on the roof of some buildings without contravening the technical standards in force. Specifically, the majority of known photovoltaic panels generally feature a front face made of glass and a metal support framework such that a single photovoltaic panel often weighs more than 20 kg, or even 30 kg for some models. If the support structures required for the installation of the photovoltaic panels are also added to this, an additional load of 15 kg/m$^2$ or more for a roof is reached.

Thus, there is a barrier preventing large areas currently available from being provided with photovoltaic panels, in particular old buildings due to their limited dimensioning in terms of load.

For a new build, providing such a load may in some cases represent an additional construction expense which slows the return on investment when it is desired to fit its roof with photovoltaic panels.

Furthermore, the roofs of these commercial or industrial buildings generally exhibit a relatively gentle slope. It may be advantageous to install the panels parallel to the slope in order to maximize absolute photovoltaic yield, in particular for small areas.

However, photovoltaic panels installed parallel to the slope or in line with this slope may become dirty quite quickly due to their gentle slope. Specifically, rainwater for example will trickle away quite slowly and may leave marks on the surface exposed to the sun's rays. Furthermore, this surface is also highly exposed to dust or solid particles (e.g. sand, material from trees, ash particles, fine particulate matter, etc.). However, due to the gentle slope of these roofs and hence the small incline of the photovoltaic panels, this dust may be deposited readily and potentially for a long time. Such a photovoltaic panel is therefore more likely to become soiled. Lastly, moisture, the gentle slope and organic particles may facilitate the growth of moss, lichen or microscopic fungi in particular in areas of surface roughness.

Thus, this soiling may negatively affect the productivity of such photovoltaic panels and may lead to quite substantial costs due to the cleaning and maintenance thereof.

The object of the present invention is to overcome the various drawbacks of the prior art mentioned above, in particular by providing a laminate of photovoltaic cells for which maintenance operations are limited and which makes it possible to hold back, at least partially, the decrease in electricity production with time due to soiling.

In order to meet, at least partially, at least one of the objects mentioned above, one subject of the present invention is a flexible laminate of photovoltaic cells comprising:
  a layer of photovoltaic cells that are connected to one another;
  a front layer and a back layer for encapsulating the layer of photovoltaic cells in which the flexible laminate features an outer film made of flexible material with anti-soiling properties which is deposited on the front encapsulation layer, said outer film exhibiting an average roughness that is less than 1 μm, in particular between 0.1 μm and 0.5 μm.

The presence of the outer film on the front encapsulation layer allows this layer to be protected and the soiling thereof due to exposure of the flexible laminate of photovoltaic cells to poor weather and to dust to be limited. This outer film therefore allows maintenance operations on such a laminate to be limited or spaced further apart in time. Additionally, by preventing the soiling of the flexible laminate of photovoltaic cells, it is thus possible to maintain a good level of irradiation of the photovoltaic cells when they are exposed to sunlight. Moreover, the average roughness of this outer film in the state when deposited on the front encapsulation layer allows the possible adhesion of dirt, such as dust for example, thereto to be limited due to its low level of roughness.

The laminate may further comprise one or more of the following features, taken individually or in combination.

According to one aspect, the maximum roughness of the outer film made of flexible material is for example less than 3 μm, in particular between 0.1 μm and 2.6 μm.

According to one particular embodiment, the photovoltaic cells are silicon-, in particular monocrystalline or polycrystalline silicon-, based cells.

The flexible material used for the outer film is for example a polymer.

According to one particular embodiment, the polymer forming the outer film made of flexible material is chosen from the family of polyvinylidene fluorides (PVDFs), polyvinyl fluorides (PVFs), ethylene tetrafluoroethylenes (ETFEs), or polyethylene terephthalates (PETs), polyurethanes, acrylics or silicones.

The thickness of the outer film made of flexible material is between 10 μm and 500 μm.

According to one particular embodiment, the outer film made of flexible material may exhibit anti-reflective properties in particular due to the nature of the materials such as thin layers or due to the surface texture.

According to one aspect, the thicknesses of each of the front and back encapsulation layers are between 0.05 mm and 3 mm.

Additionally, each of the front layers includes a glass-fiber fabric and an encapsulation resin.

Another subject of the present invention is a method for decreasing or limiting soiling on the surface of a flexible laminate of photovoltaic cells comprising a layer of photovoltaic cells that are connected to one another, a front layer and a back layer for encapsulating the layer of photovoltaic cells, said method comprising the application of an outer film made of flexible material with anti-soiling properties to the front layer, said outer film exhibiting an average roughness that is less than 1 μm, in particular between 0.1 μm and 0.5 μm.

According to one aspect, the outer film is laminated at the same time as the layers of photovoltaic cells and the front and back encapsulation layers.

According to one variant, the outer film is deposited on the flexible laminate after a step of laminating the layers of photovoltaic cells and the front and back encapsulation layers.

According to this variant, the outer film may cooperate with the front encapsulation layer through bonding.

According to an alternative form of this variant, the outer film may be applied in liquid form to the front encapsulation layer then solidified.

According to this alternative form, the outer film may be solidified thermally.

Figure 2:
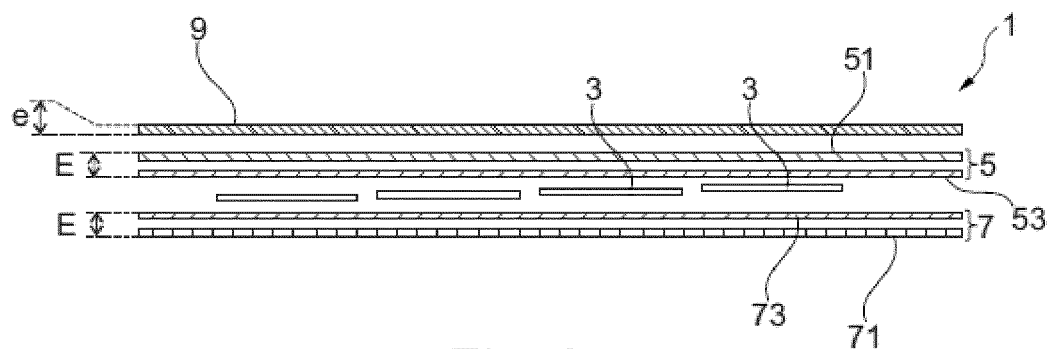

Other features and advantages of the present invention will become more clearly apparent upon reading the following description, provided by way of non-limiting illustration and with reference to the appended drawings, in which:

FIG. 1 schematically shows the top of a flexible laminate;

FIG. 2 schematically shows a cross section through a flexible laminate according to one embodiment.

In these figures, identical elements bear the same reference numerals.

The following embodiments are examples. Although the description makes reference to one or more embodiments, this does not necessarily mean that each reference relates to the same embodiment, or that the features apply to only one embodiment. Single features of different embodiments may also be combined or interchanged to yield other embodiments.

The term "front layer" in the following description is understood to mean the surface of the flexible laminate which is exposed first to the sun's rays when the flexible laminate is in the installed state. Similarly, the term "back layer" in the following description is understood to mean the layer opposite the front layer, i.e. the surface which is exposed last to the sun's rays as they pass through the laminate when the laminate is in the installed state.

Next, the term "transparent" in the following description is understood to mean a, preferably colorless, material through which light may pass with a maximum absorption of 10% of the wavelengths between in particular 280 nm and 1300 nm.

Additionally, the term "film made of flexible material" in the following description is understood to mean that, when a certain radius of curvature is applied, the film does not crack. In the present invention, the material should withstand a radius of curvature of 80 cm without damage.

Furthermore, the term "flexible" in the following description is understood to mean an element exhibiting the flexibility characteristics mentioned above.

In addition, with reference to FIG. 2, the various layers that make up a flexible laminate 1 are spaced apart from one another. This representation is provided solely for ease of identification of the various layers. When the flexible laminate 1 is in the delivered state, the various layers shown are in contact with one another.

With reference to FIGS. 1 and 2, a flexible laminate 1 of photovoltaic cells 3 for forming for example a photovoltaic module or panel is shown. The flexible laminate 1 comprises a layer of photovoltaic cells 3, which, in this particular representation, is composed of four strips of photovoltaic cells 3, which are connected to one another, a front layer 5 and a back layer 7 for encapsulating the layer of photovoltaic cells 3. This flexible laminate 1 may for example be obtained by means of a conventional lamination method, i.e. by raising the temperature of a stack of various layers forming the laminate 1 and then applying pressure to this stack for a determined duration under vacuum or under an inert atmosphere for example. The flexibility of the laminate 1 is obtained by virtue of the constituent materials of the various layers that make up this laminate 1, as will be explained in greater detail further below. The use of a flexible laminate 1 for such a photovoltaic module or panel facilitates the transport and installation thereof since it is not as fragile.

With reference to FIG. 2, the front 5 and back 7 encapsulation layers each comprise a glass-fiber fabric 51, and an encapsulation resin 53, 73. The presence of a glass-fiber fabric 51, 71 in the front 5 and back 7 encapsulation layers allows in particular the ability of this laminate 1 to withstand collisions and impacts to be enhanced. Furthermore, the glass-fiber fabrics 51, 71 are embedded in the encapsulation resin. Thus, the glass-fiber fabric 51 of the front encapsulation layer 5 does not impart any particular roughness to the flexible laminate 1, at least on the outer surface of the front encapsulation layer 5.

More particularly, the encapsulation resin 53, 73 is arranged between the layer of photovoltaic cells 3 and the glass-fiber fabric 51, 71 in order to ensure cohesion between the glass-fiber fabric 51, 71 and the layer of photovoltaic cells 3.

As a variant, each of the front 5 and back 7 two layers may be formed of a single layer of impregnated glass-fiber fabric.

Of course, at least the front encapsulation layer 5 is transparent so as to allow the sun's rays to reach the layer of photovoltaic cells 3 in order to allow them to be photovoltaically converted into electrical energy.

Once the flexible laminate 1 is installed, the sun's rays first penetrate the front encapsulation layer 5, then the layer of photovoltaic cells 3 and lastly, if they are not absorbed, the back encapsulation layer 7.

Thus, this front encapsulation layer 5 is highly exposed to dust and to the vagaries of the weather which may make it dirty due to its positioning. Specifically, dirt may be deposited on this front encapsulation layer 5 and result in the absorption or scattering of light, which may decrease the electricity production of the photovoltaic panel.

To prevent this soiling, the flexible laminate 1 includes an outer film 9 made of flexible material that exhibits anti-soiling properties and is transparent, which is arranged on the front encapsulation layer 5.

It is therefore the outer film 9 which will be directly exposed to the soiling that may result from exposure to the outside environment. More particularly, this outer film 9 made of flexible material exhibits an average roughness that is less than 1 μm, in particular between 0.1 μm and 0.5 μm.

The term "average roughness" is understood here to mean the roughness such as defined in ISO standard 4287 and generally represented by the symbol Ra which corresponds to the arithmetic average of all of the ordinates of the outer film 9 within a sampling length.

Specifically, such an average roughness for this outer film 9 makes it possible to limit the adhesion of the dust and sandy material that may for example be contained in rainwater so as to limit and to prevent the deposition of dirt and potentially the growth of mold on the laminate 1. In the present description, the average roughness of the outer film 9 corresponds to the roughness of the outer surface of the flexible laminate 1 that features the outer film 9. This average roughness therefore corresponds to the roughness of this outer surface featuring the outer film 9.

Specifically, the lower the roughness of the outer film 9, the lesser the extent to which dirt may attach itself to this outer film 9, since the possibility for it to adhere to this layer is greatly decreased.

Thus, the presence of the outer film 9 allows cleaning and maintenance operations that are to be carried out on this flexible laminate 1, and hence the costs resulting from such operations, to be spaced further apart.

Additionally, to minimize the possibility of dirt adhering to the laminate 1, the outer film 9 exhibits a maximum roughness that is less than 3 µm, and in particular between 0.1 µm and 2.6 µm. The term "maximum roughness" is understood here to mean the roughness that is generally represented by the symbol Rz which corresponds to the sum of the greatest height of the profile and the lowest recess depth of the front outer layer 9 within a sampling length averaged over the total number of sampling lengths. Specifically, the maximum roughness for this outer film 9 is also a parameter to be taken into account, since if the flexible laminate 1 features sites of high roughness in some areas, dirt may build up around these sites and negatively affect the conversion efficiency of the photovoltaic panel which includes the laminate. Thus, the maximum roughness also corresponds in this case to the maximum roughness of the outer surface of the flexible laminate 1 when the outer film 9 is arranged on the front encapsulation layer 5.

Thus, the flexible laminate 1 features at least one front layer including a smooth outer surface which limits the possibility of dirt such as dust, for example, adhering to this outer surface which makes it possible, inter alia, to limit maintenance operations on this flexible laminate 1.

Furthermore, the flexible material used for the outer film 9 is a transparent polymer.

The polymer forming the outer film 9 made of flexible material is chosen from the family of polyvinylidene fluorides (PVDFs), polyvinyl fluorides (PVFs), ethylene tetrafluoroethylenes (ETFEs), or polyethylene terephthalates (PETs), polyurethane, silicones or acrylics. Such polymers are compatible with lamination processes.

The outer film 9 may be applied in solid form (plastic film for example) or as a liquid with subsequent elastic solidification. Alternatively, the outer film 9 may be laminated onto the laminate 1 at the same time as the layers of photovoltaic cells 3 and the front 5 and back 7 encapsulation layers.

The "transparency" of the outer film 9 is due not only to its absorption capabilities but also to its thinness. Thus, an outer film 9 may exhibit, in the wavelength operating range of the photovoltaic cells, an absorption band or peak, but because of the thinness of the outer film 9, the chance of absorption is low and results in a degree of absorption by the outer film 9 of less than 10%.

Additionally, the use of fluoropolymers allows the resistance of the flexible laminate 1, and in particular that of the front outer layer 9, to moisture or to acid attack to be increased. Furthermore, when the polymer forming the outer film 9 made of flexible material is chosen from polyethylene terephthalates (PETs), this outer film 9 takes the form of a tri-layer film, at least one layer of which is composed of polyethylene terephthalate.

The use of such a polymer also allows properties of resistance to moisture or to acid attack, in particular, to be imparted to the outer film 9. Thus, the maintenance and operating costs of this flexible laminate 1 are reduced.

Such materials exhibit maximum and average roughness characteristics that are compatible with the values required to limit the soiling of the flexible laminate 1. In addition, such materials are dielectric materials. Thus, their attractiveness to dust, for example via electrostatic effect, is limited, which also makes it possible to limit the soiling of the flexible laminate 1. Furthermore, the use of such materials allows the outer film 9 made of flexible material to exhibit anti-reflective properties so as to optimize the photovoltaic conversion efficiency of the flexible laminate 1.

The photovoltaic cells 3 forming the layer of photovoltaic cells 3 in this flexible laminate 1 are for example monocrystalline or polycrystalline silicon-based cells. The use of monocrystalline silicon allows good photovoltaic conversion efficiency per square meter. Furthermore, such a material also exhibits good resistance to aging, which allows the service life of this flexible laminate 1 to be increased.

The thickness of the outer film 9 made of flexible material is between 20 µm and 500 µm. Such a thickness of the outer film 9 made of flexible material makes it possible to correct potential surface defects on the front encapsulation layer 5 on which this film is arranged such that the flexible laminate 1 exhibits the maximum and average roughnesses defined above so as to limit the possibility of dirt adhering to this front outer layer 9.

Additionally, thicknesses E of each of the front 5 and back 7 encapsulation layers are between 0.05 mm and 3 mm. Such a thickness E of the front 5 and back 7 encapsulation layers allows a flexible laminate 1 of low thickness to be obtained, which makes it possible in particular to decrease the costs related to the transport and weight thereof. According to the particular embodiments shown here, the thicknesses E of the front 5 and back 7 encapsulation layers are the same. However, according to one variant (not shown here), the thicknesses of these front 5 and back 7 encapsulation layers may be different.

According to the particular embodiment of FIG. 2, the front 5 and back 7 encapsulation layers are both transparent. Thus, the sun's rays pass through the entire flexible laminate 1.

According to the embodiment which is not shown, the back encapsulation layer 7 may be non-transparent and/or reflective.

The flexible laminate 1 described with reference to FIGS. 1 and 2 therefore makes it possible to implement a method allowing soiling on the surface of the flexible laminate 1 of photovoltaic cells 3 to be decreased or limited.

The outer film 9, exhibiting an average roughness that is less than 1 µm and in particular between 0.1 µm and 0.5 µm, may be deposited on the front encapsulation layer 7 before lamination and be laminated at the same time as the layers 3, 5 and 7. According to one variant, it may be deposited on and attached to the laminate 1 after lamination, for example by bonding or by being applied in liquid form with subsequent solidification.

When the outer film 9 is deposited on the front encapsulation layer 5 in liquid form and then solidified, this deposition operation may for example be performed by means of a spin-coating or a dip-coating process, for example. However, other deposition processes may be envisaged, such as for example spraying. Additionally, the outer film 9 may be solidified thermally, for example. To this end, the laminate with the outer film 9 in liquid form may be placed in an oven in order to evaporate the solvent and thus solidify the outer film 9. However, other methods for solidifying this outer film 9 may be envisaged, for example cross-linking the constituent material of this outer film 9.

The exemplary embodiments described here are examples provided by way of illustration and are non-limiting. Specifically, it is entirely possible for a person skilled in the art to use photovoltaic cells 3 other than monocrystalline silicon-based cells, for example polycrystalline silicon-based cells, or organic cells or inorganic thin layers, without departing from the scope of the present invention.

Thus, limiting maintenance operations while retaining good photovoltaic conversion efficiency is possible by virtue of the use of the flexible laminate 1 described above and in particular by virtue of the outer film 9 that is arranged on the front encapsulation layer 7 and exhibits anti-soiling properties.

The invention claimed is:

1. A flexible laminate of photovoltaic cells, comprising:
   a layer of photovoltaic cells that are connected to one another;
   a front layer and a back layer configured to encapsulate the layer of photovoltaic cells, the front layer comprising a glass-fiber fabric disposed on a layer of resin encapsulation; and
   a transparent outer film of flexible material with anti-soiling properties disposed directly on the front layer, the outer film comprising a polymer material, the polymer material having an outer surface having an average roughness that is less than 1 μm and a maximum roughness of less than 3 μm.

2. The flexible laminate according to claim 1, wherein the average roughness is between 0.1 μm and 0.5 μm.

3. The flexible laminate according to claim 1, wherein the maximum roughness of the outer film is between 0.1 μm and 2.6 μm.

4. The flexible laminate according to claim 1, wherein the photovoltaic cells are silicon-based cells.

5. The flexible laminate according to claim 1, wherein the outer film is in contact with the resin encapsulation.

6. The flexible laminate according to claim 5, wherein the polymer is made of flexible material chosen from a family of polyvinylidene fluorides (PVDFs), polyvinyl fluorides (PVFs), ethylene tetrafluoroethylenes (ETFEs), or polyethylene terephthalates (PETs), polyurethane, acrylics, or silicones.

7. The flexible laminate according to claim 1, wherein a thickness of the outer film is between 10 μm and 500 μm.

8. The flexible laminate according to claim 1, wherein a thickness of each of the front layer and the back layer is between 0.2 mm and 3 mm.

9. The flexible laminate according to claim 1, wherein the back layer includes a glass-fiber fabric and an encapsulation resin.

10. The flexible laminate according to claim 1, wherein the average roughness is between 0.1 μm and 0.5 μm; and the maximum roughness of the outer film is between 0.1 μm and 2.6 μm.

11. The flexible laminate according to claim 1, wherein the outer film has antireflective properties.

12. The flexible laminate according to claim 1, wherein the glass fiber fabric is embedded in the layer of resin encapsulation.

13. The flexible laminate according to claim 1, wherein the outer film is made of a material through which light may pass with a maximum absorption of 10% of wavelengths between 280 nm and 1300 nm.

14. The flexible laminate according to claim 1, wherein the laminate is configured to transmit light through the outer film and front layer to the layer of photovoltaic cells.

15. A method for decreasing or limiting soiling on a surface of a flexible laminate of photovoltaic cells comprising a layer of photovoltaic cells that are connected to one another, a front layer comprising a glass fiber fabric disposed on a layer of resin encapsulation and a back layer configured to encapsulate the layer of photovoltaic cells, the method comprising applying a transparent outer film of flexible material with anti-soiling properties directly on the front layer in contact with the resin encapsulation, the outer film comprising a polymer material with an outer surface having an average roughness that is less than 1 μm and a maximum roughness of less than 3 μm.

16. The method according to claim 15, wherein the average roughness is between 0.1 μm and 0.5 μm.

17. The method according to claim 15, wherein the outer film is laminated at a same time as the layer of photovoltaic cells and the front and the back layers.

18. The method according to claim 15, wherein the outer film is deposited on the flexible laminate after a step of laminating the layer of photovoltaic cells and the front and the back layers.

19. The method according to claim 18, wherein the outer film cooperates with the front layer through bonding.

20. The method according to claim 18, wherein the outer film is applied in liquid form to the front layer and then is solidified.

21. The method according to claim 18, wherein
   the average roughness is between 0.1 μm and 0.5 μm; and
   the maximum roughness of the outer film is between 0.1 μm and 2.6 μm.

22. The method according to claim 18, wherein the average roughness is between 0.1 μm and 0.5 μm.

* * * * *